(12) United States Patent
Muddu

(10) Patent No.: US 6,853,969 B1
(45) Date of Patent: Feb. 8, 2005

(54) METHOD AND SYSTEM FOR ESTIMATING INTERCONNECT DELAY

(75) Inventor: Sudhakar Muddu, Milpitas, CA (US)

(73) Assignee: Silicon Graphics, Inc., Mountain View, CA (US)

( * ) Notice: Subject to any disclaimer, the term of this patent is extended or adjusted under 35 U.S.C. 154(b) by 810 days.

(21) Appl. No.: 09/713,842

(22) Filed: Nov. 15, 2000

(51) Int. Cl.$^7$ .............................................. G06F 17/50
(52) U.S. Cl. ................................ 703/19; 703/2; 703/14; 716/6
(58) Field of Search ............................. 703/2, 14, 19; 716/6, 4, 2

(56) References Cited

U.S. PATENT DOCUMENTS

| | | | | |
|---|---|---|---|---|
| 5,313,398 A | * | 5/1994 | Rohrer et al. ................ | 703/14 |
| 5,379,231 A | * | 1/1995 | Pillage et al. ................ | 703/14 |
| 6,460,165 B1 | * | 10/2002 | Ismail et al. ................. | 716/1 |
| 6,496,960 B1 | * | 12/2002 | Kashyap et al. .............. | 716/4 |

* cited by examiner

Primary Examiner—Albert W. Paladini
(74) Attorney, Agent, or Firm—Baker Botts L.L.P.

(57) ABSTRACT

A system and method for estimating interconnect delay are disclosed that include determining inductance of an interconnect. A transfer function is determined using the inductance, and two poles of the transfer function are determined. An interconnect delay is estimated using the two poles.

22 Claims, 3 Drawing Sheets

METHOD AND SYSTEM FOR ESTIMATING INTERCONNECT DELAY

TECHNICAL FIELD OF THE INVENTION

This invention relates generally to the field of system design and more specifically to a method and system for estimating interconnect delay.

BACKGROUND OF THE INVENTION

Accurate calculation of interconnect delay is critical to the design of high speed integrated circuits. Signals travel along paths that include the interconnects and gates of an integrated circuit. The interconnects contribute to the delay of the signal along the path. Accurate calculation of interconnect delays, however, is typically time-consuming and expensive. Accordingly, calculating interconnect delay has posed a challenge for integrated circuit designers.

SUMMARY OF THE INVENTION

In accordance with the present invention, a method and system for estimating interconnect delay are provided that substantially eliminate or reduce the disadvantages and problems associated with previously developed systems and methods.

According to one embodiment of the present invention, a method for estimating interconnect delay is disclosed that includes determining inductance of an interconnect. A transfer function is determined using the inductance, and two poles of the transfer function are determined. An interconnect response is estimated using the two poles, and an interconnect delay is estimated from the interconnect response.

According to one embodiment of the present invention, a system for estimating interconnect delay is disclosed that includes a memory that stores information about an interconnect. A processor determines an inductance of the interconnect from the information, a transfer function using the inductance, and two poles of the transfer function. The processor also estimates an interconnect response using the two poles, and an interconnect delay from the interconnect response.

Embodiments of the invention may provide numerous technical advantages. A technical advantage of one embodiment is that the interconnect delay is determined using the inductance of the interconnect. Global interconnects typically have large cross-sections and are driven by drivers with small resistance. This may result in an inductive impedance that is greater than a resistive impedance and that affects interconnect delay. Accordingly, interconnect delay is estimated using inductance in order to improve the accuracy of the estimation.

Another technical advantage of one embodiment is that the interconnect delay is estimated according to a damping response of the interconnect. When inductance is taken into account, the damping response may also be determined, which provides a better description of the interconnect. Accordingly, estimating interconnect delay according to the damping response provides an improved estimate.

Another technical advantage of one embodiment is that the embodiment may be used to estimate interconnect delay for system design, interconnect design, circuit design, board design, and backplane design, among other areas of computer design.

Other technical advantages are readily apparent to one skilled in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Figure 1:
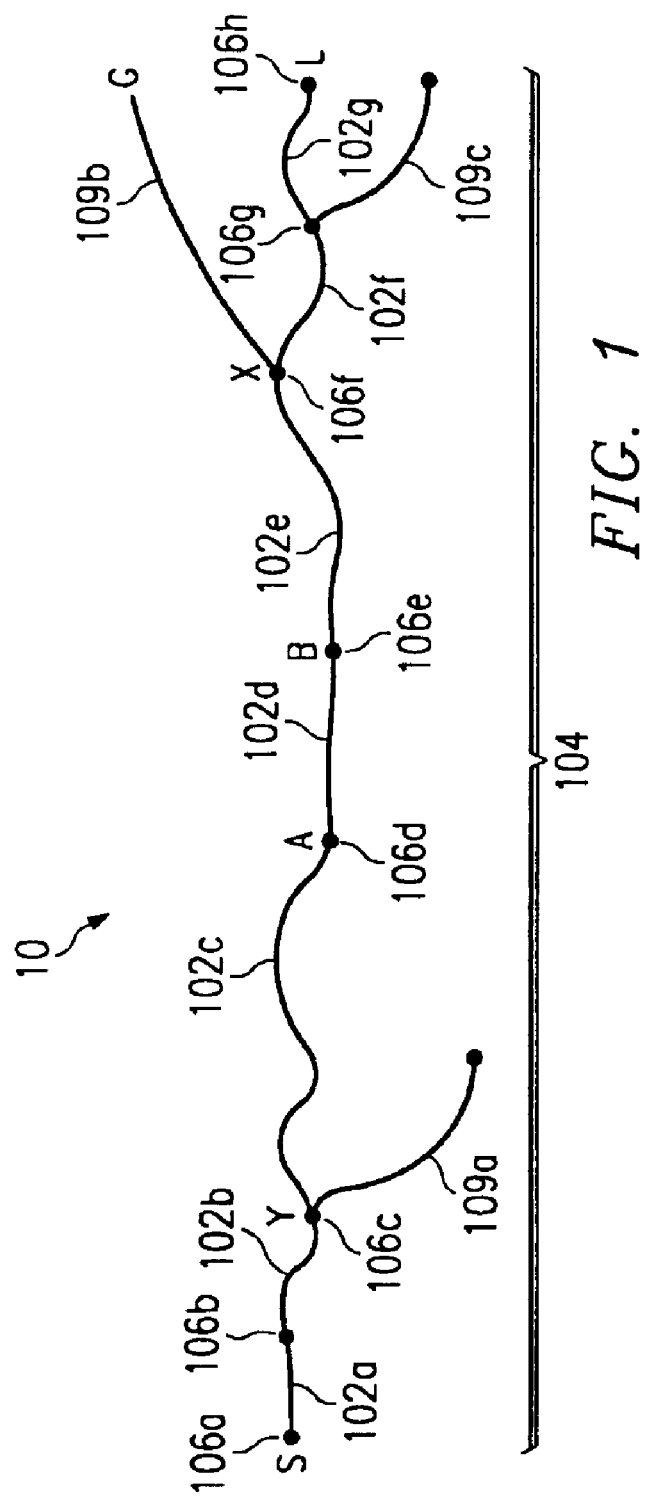
FIG. 1 illustrates a routing tree with interconnects for which interconnect delay may be estimated.
Figure 2:
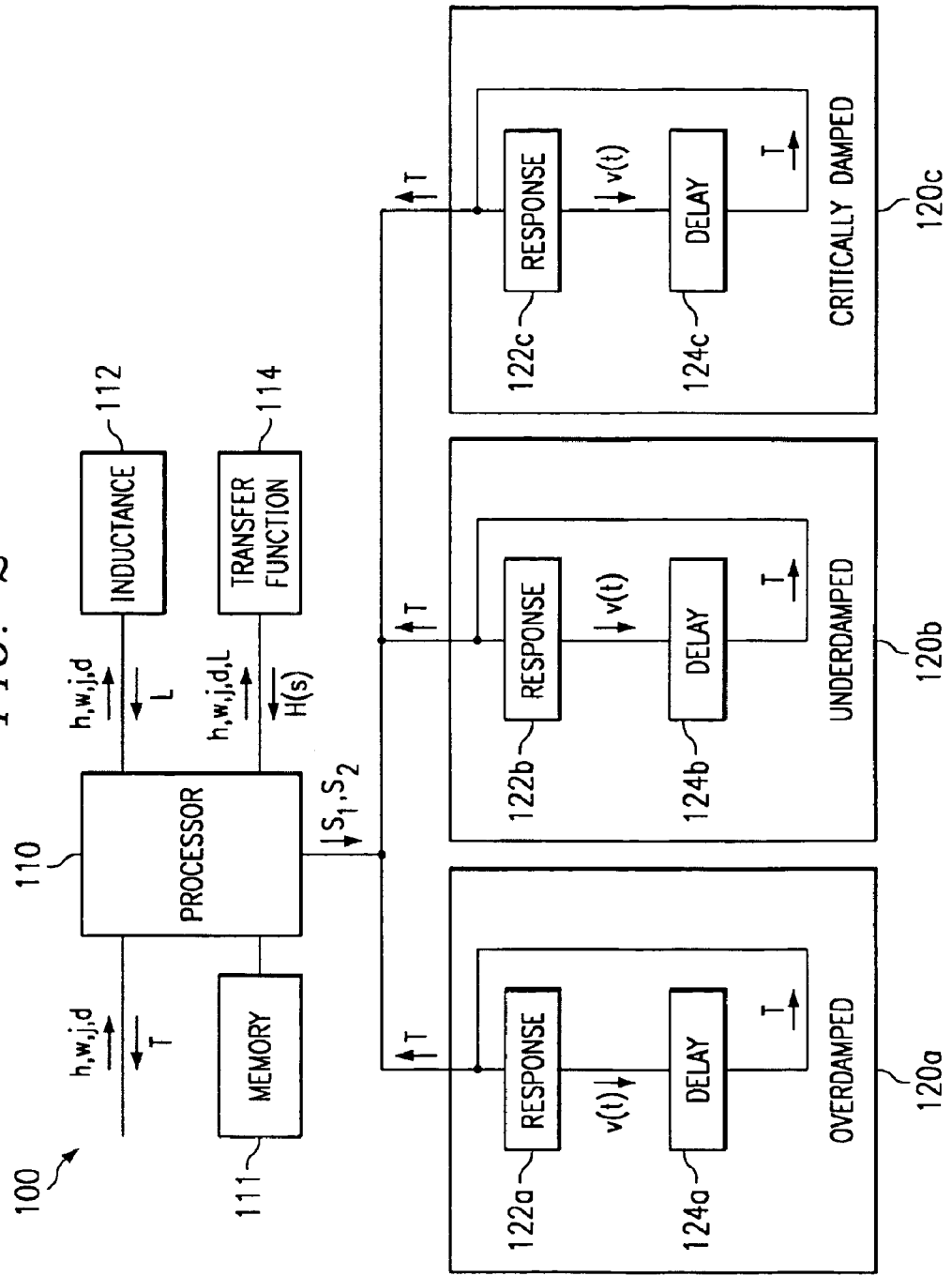
FIG. 2 is a block diagram of a system for estimating interconnect delay.
Figure 3:
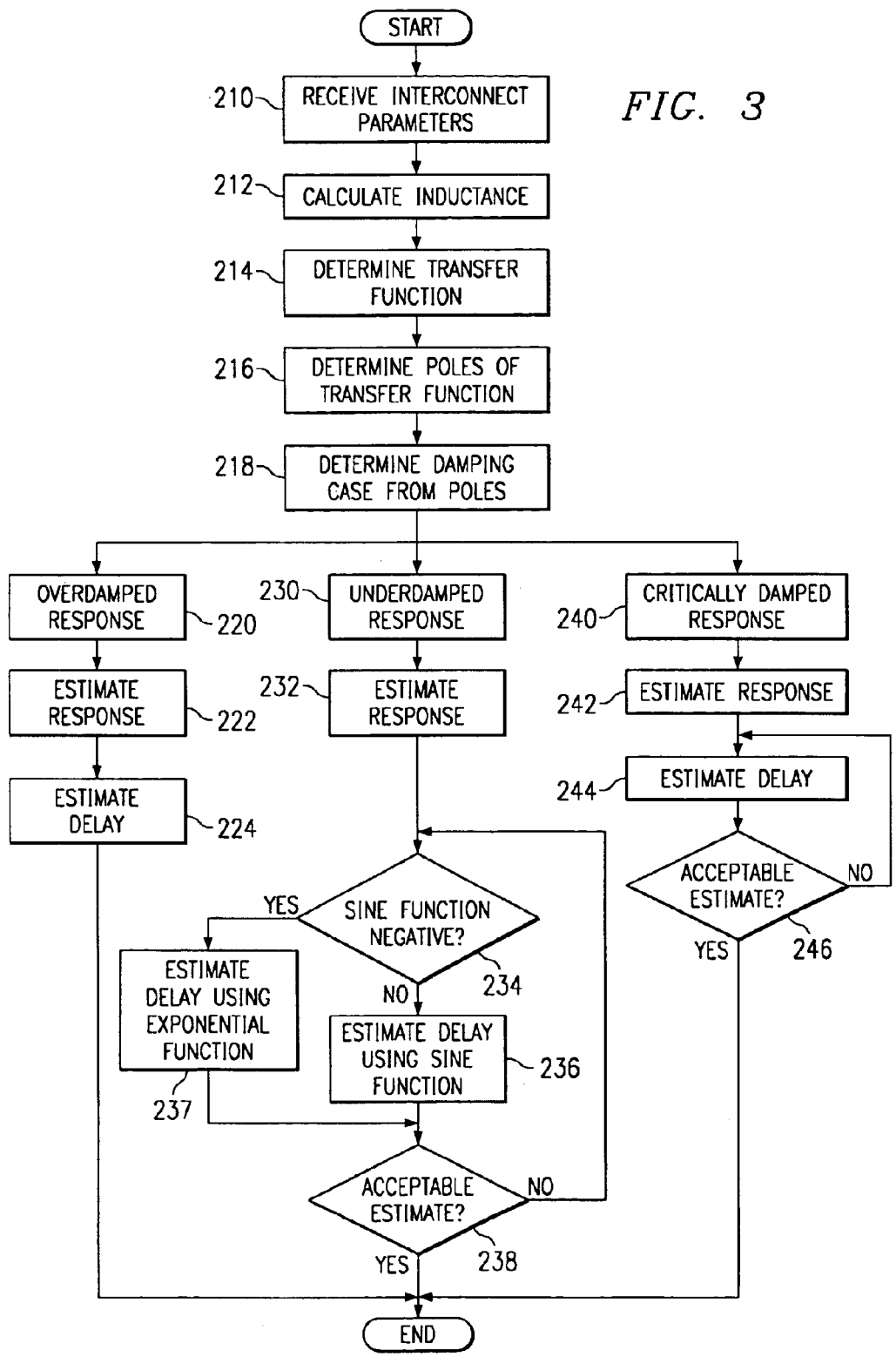
FIG. 3 is a flowchart of a method for estimating interconnect delay.

Embodiments of the present invention and its advantages are best understood by referring to FIGS. 1 through 3 of the drawings, like numerals being used for like and corresponding parts of the various drawings.

FIG. 1 illustrates a routing tree 10 with interconnects 102 for which interconnect delay may be estimated. Routing tree 10 represents, for example, the layout of an integrated circuit such as a large-scale integration (LSI), very-large-scale integration (VLSI), super-large-scale integration (SLSI), or ultra-large-scale integration (ULSI) integrated circuit. Routing tree 100 includes nodes 106 and interconnects 102, 104, and 109 coupling nodes 106. Nodes 106 represent elements such as transistors of an integrated circuit, and interconnects 102, 104, and 109 represent connections such as wires between the elements. Interconnect 104 from node S 106a to node L 106h, where node S 106a is a source node and node L 106h is a load node, includes interconnects 102 and nodes 106.

Response describes the behavior of an interconnect in accordance with an applied signal, for example, the response of interconnect 102d describes the behavior at node B 106e in response to a signal applied at node A 106d. Delay describes the time interval between the instant a signal is applied to an interconnect and the instant the interconnect acts accordingly, for example, the time interval between the application of a signal at node A 106d and a response to the signal at node B 106e. A transfer function of an interconnect is used to derive the response and delay of the interconnect. Parameters of an interconnect may be used to determine attributes of the interconnect, which in turn may be used to derive coefficients, or alternatively moments, of a transfer function. Parameters of an interconnect such as a wire, include the length h, width w, thickness j, and dielectric coefficient of the wire. The distance d between interconnects may also be a parameter. Attributes may include the resistance R, capacitance C, and inductance L of the interconnect.

FIG. 2 is a block diagram of a system 100 for estimating interconnect delay. System 100 receives parameters of an interconnect 102, for example, a length h, width w, and thickness j of interconnect 102 and a distance d between interconnects, and estimates an interconnect delay T for interconnect 102.

System 100 includes a processor 110 coupled to a memory 111, an inductance module 112, a transfer function module 114, an overdamped module 120a, an underdamped module 120b, and a critically damped module 120c. The operations of the processor and modules of system 100 may be performed by any number, combination, or arrangement of processors or modules, and may be performed by any combination of hardware, software, or both. Processor 110 manages system 100 to estimate interconnect delay and stores data in memory 111. Inductance module 112 receives parameter information about interconnect 102 from processor 110, and computes an inductance L of interconnect 102. Transfer function module 114 determines a transfer function H(s) using inductance L calculated by inductance module 112, and other interconnect attributes such as resistance R and capacitance C calculated by processor 110. Processor 110 determines the poles $s_1$ and $s_2$ of transfer function H(s), and determines a damping case, for example, an overdamped response, an underdamped response, or a critically damped response, from poles $s_1$ and $s_2$.

Overdamped module 120a receives poles $s_1$ and $s_2$ if the damping case is an overdamped response. A response module 122a computes an overdamped response v(t), and a delay module 124a computes a interconnect delay T. Underdamped module 120b receives poles $s_1$ and $s_2$ if the damping case is an underdamped response. A response module 122b computes an underdamped response v(t), and a delay module 124b computes a interconnect delay T. Critically damped module 120b receives poles $s_1$ and $S_2$ if the damping case is a critically damped response. A response module 122c computes a critically damped response v(t), and a delay module 124c computes a interconnect delay T.

Unlike known systems, system 100 for calculating interconnect delay takes interconnect inductance into account. Additionally, system 100 calculates interconnect delay based on a damping response, unlike known systems. Consequently, system 100 provides accurate estimates of interconnect delay.

FIG. 3 is a flowchart of a method for estimating interconnect delay. The method begins at step 210, where interconnect parameters are received by processor 110. Interconnect parameters include length h, width w, and thickness j of interconnects 102, and a distance d between interconnects 102.

Interconnect inductance, such as the self and mutual inductance of the interconnects, is calculated by inductance module 112 at step 212. In one embodiment, interconnects 102 may include signal and shield lines. The width w of the signal line is approximately equal to the spacing between adjacent signal lines, and the width of a shield line is approximately twice the width w of a signal line. Self-inductance $L_{self}$ for the signal and shield lines may be computed from interconnect parameters length h, width w, and thickness j using Equation (1):

$$L_{self} = \frac{\mu_0}{2*\pi} * h * \left[0.5 + \ln\left(\frac{2h}{w+j}\right) + 0.2235(w+j)\right] \quad (1)$$

The mutual inductance $M_{12}$ between two lines separated by a distance d is given by Equation (2):

$$M_{12} = \frac{\mu_0}{2*\pi} * h * \left[\ln\left(\frac{2h}{d}\right) + -1 + \frac{d}{h}\right] \quad (2)$$

The inductance $L_{loop}$ of a current loop between a signal line and a shield line may be computed using Equation (3):

$$L_{loop} = L_{self}^{sig} + L_{self}^{shld} - M_{sig2shld} - M_{shld2shld} \quad (3)$$

$L_{self}^{sig}$ represents the self-inductance of a signal line, and $L_{self}^{shld}$ represents the self-inductance of a shield line. $M_{sig2shld}$ represents the mutual inductance between the signal and shield lines on both sides of the signal line, and $M_{shld2shld}$ represents the mutual inductance between two shield lines on both sides of the signal line. The inductance L of an interconnect is the sum of the self-inductance and the loop inductance.

A transfer function H(s) is calculated using inductance L at step 214. Transfer function module 114 provides processor 110 with a transfer function H(s), which is expressed by Equation (4):

$$H(s) = \frac{1}{1 + b_1 s + b_2 s^2} \quad (4)$$
$$= 1 + sM_1 + sM_2$$

The coefficients $b_1$ and $b_2$ are functions of interconnect 102 and receiving node 106 attributes, as expressed by Equations (5):

$$b_1 = \frac{RC}{2} + RC_N \quad (5)$$
$$b_2 = \frac{(RC)^2}{24} + \frac{R^2 CC_N}{6} + \frac{LC}{2} + LC_N$$

where $C_N$ is the receiving node 106 capacitance, and R is resistance, C is capacitance, and L is the inductance of the interconnect 102. Inductance L is received from inductance module 112, and resistance R and capacitance C and $C_N$ are computed by processor 110 from received interconnect parameters.

Poles $s_1$ and $s_2$ of the transfer function H(s) are determined at step 216. Processor 110 receives transfer function H(s) and determines poles $s_1$ and $s_2$ of the transfer function H(s), as expressed by Equation (6):

$$s_{1,2} = \frac{2}{-M_1 \pm \sqrt{4M_2 - 3M_1^2}} = \frac{-b_1 \pm \sqrt{b_1^2 - 4b_2}}{2b_2} \quad (6)$$

A damping case is determined from poles $s_1$ and $s_2$ at step 218. If the poles are real, the damping case is determined to be an overdamped response. The condition for the poles to be real is given by Equation (7):

$$\overline{4M_{s-3}M_1^2} = \overline{b_1^2 - 4b_2} > 0 \quad (7)$$

If the poles are complex, the damping case is determined to be an underdamped response. The condition for the poles to be complex is given by Equation (8):

$$\overline{b_1^2 - 4b_2} < 0 \quad (8)$$

If there are double poles, the damping case is determined to be a critically damped response. The condition for double poles is given by Equation (9):

$$\overline{b_1^2 - 4b_2} = 0 \quad (9)$$

Overdamped module 120a receives poles $s_1$ and $s_2$ at step 220, if the damping case is determined to be an overdamped response. A response is estimated at step 222. Response module 122a receives the poles and computes an overdamped response v(t) using Equation (10):

$$v(t) = V_0 \left(1 - \frac{s_2}{s_2 - s_1} e^{s_1 t} + \frac{s_1}{s_2 - s_1} e^{s_2 t}\right) \quad (10)$$

where $V_0$ is the steady state voltage. A delay is estimated from the overdamped response v(t) at step 224 by delay module 124*a*. The contribution of $s_2$ to overdamped response v(t) may be neglected, since $s_2$ is smaller than $s_1$. Delay module 124*a* uses Equation (11) to compute the delay T:

$$T = \ln1(1 - v_{th}) * \frac{1}{|s_1|} = \ln1(1 - v_{th}) * \frac{2b_2}{b_1 - \sqrt{b_1^2 - 4b_2}} \qquad (11)$$

where $v_{th}$ is the threshold voltage for the damping response.

An underdamped module 120*b* receives poles $s_1$ and $s_2$ at step 230, if the damping case is determined to be an underdamped response. A response is estimated at step 232. Response module 122*b* computes an underdamped response using Equation (12):

$$v(t) = V_0\left(1 - \frac{\sqrt{\alpha^2 + \beta^2}}{\beta} e^{-\alpha t} * \sin(\beta t + \rho)\right) \text{ where} \qquad (12)$$

$$\alpha = \frac{M_1}{2(M_1^2 - M_2)}, \beta = \frac{\sqrt{3M_1^2 - 4M_2}}{2(M_1^2 - M_2)}, \text{ and } \rho = \tan^{-1}\left(\frac{\beta}{\alpha}\right).$$

The value of a sine function $\sin(\beta t + \rho)$ is calculated at step 234 to determine whether a sine delay function or an exponential delay function is to be use to estimate the interconnect delay.

If $\sin(\beta t + \rho)$ is zero or greater at step 234, the method proceeds to step 236, where a sine function is used to estimate the delay. Delay module 124*b* computes a delay T from response v(t) by solving response v(t) recursively for the time variable t. A next delay $T_{next}$ is calculated using a current delay value $T_{cur}$ for the time variable t of a sine function, as expressed by Equation (13):

$$T_{next} = \frac{1}{\alpha} * \ln\left[\frac{1}{(1-v_{th})} * \sin(\beta * T_{cur} + \rho) * \sqrt{1 + \alpha^2/\beta^2}\right] \qquad (13)$$

In the initial delay $T_1$ calculation, an Elmore delay value $T_{ED}$ may be used as the current delay value for the time variable t of the sine function, as expressed by Equation (14):

$$T_1 = \frac{1}{\alpha} * \ln\left[\frac{1}{(1-v_{th})} * \sin(\beta * T_{ED} + \rho) * \sqrt{1 + \alpha^2/\beta_2}\right] \qquad (14)$$

where the Elmore delay $$T_{ED} = \ln\frac{1}{(1-v_{th})} * b_1,$$

which is $T_{ED}=0.22b_1$ for a 20% threshold as the starting time. The method then proceeds to step 238 to determine whether the estimate is acceptable.

Referring back to step 234, if the sine function $\sin(\beta t + \rho)$ is negative, the method proceeds to step 237, where the delay is estimated using an exponential function, as expressed by Equation (15):

$$T_1 = \frac{K_c}{\beta} = K_c * \frac{2b_2}{\sqrt{4b_2 - b_1^2}} \qquad (15)$$

where $K_c = \frac{(1 - v_{th})}{\sqrt{1 + \left(\frac{\alpha}{\beta}\right)^2}} - \rho.$ $\sin(\beta t + \rho)$ indicates that the interconnect inductance has a stronger effect than the interconnect resistance. The method then proceeds to step 238 to determine whether the estimate is acceptable.

At step 238, if the difference is not within the predetermined range, for example, a range where $T_{next} \in [0.5T_{cur}, T_{cur}]$, then next delay $T_{next}$ is not an acceptable estimate for the interconnect delay, and the method returns to step 234 to determine whether to use the sine delay function or the exponential delay function.

If $\sin(\beta t + \rho)$ is zero or greater at step 234, the method proceeds to step 236, where the sine function is used to estimate the delay. At step 236, another next delay $T_{next}$ is computed using the previously computed delay for the value of the time variable of the sine function, as expressed by Equation (16):

$$T_2 = \frac{1}{\alpha} * \ln\left[\frac{1}{(1-v_{th})} * \sin(\beta * T_1 + \rho) * \sqrt{1 + \alpha^2/\beta^2}\right] \qquad (16)$$

The method then proceeds to step 238 to determine whether the estimate is acceptable.

If the sine function $\sin(\beta T_1+\rho)$ is negative at step 234, the method proceeds to step 237, where an exponential function is used to estimate the delay. Equation (15), where the previously computed delay is used for the value of the time variable of the exponential function, that is, where $$K_c = \frac{(1 - v_{th})e^{\alpha \cdot \eta}}{\sqrt{1 + \left(\frac{\alpha}{\beta}\right)^2}} - \rho,$$

is used to compute the delay. The method then proceeds to step 238 to determine whether the estimate is acceptable.

At 238, if the difference between the next delay $T_{next}$ and the current delay $T_{cur}$ is within a predetermined range, then next delay $T_{next}$ is an acceptable estimate for the interconnect delay at step 238, and the method terminates.

A critically damped module 120*c* receives poles $s_1$ and $s_2$ at step 240, if the damping case is determined to be a critically damped response. A response v(t) is estimated at step 242. Response module 122*c* computes a critically damped response using Equation (17):

$$v(t) = V_0\left(1 - e^{ts_i} - \frac{2t}{b_1}e^{ts_i}\right) \qquad (17)$$

A delay T is estimated at step 244 by delay module by 124*c*. Delay T is calculated from response v(t) by solving response v(t) recursively for the time variable t. A next delay $T_{next}$ is computed using a current delay value $T_{cur}$ for the time variable t of an exponential function, as expressed by Equation (18):

$$T_{next} = K_{next} * \frac{2b_2}{b_1} = K_{next} * \frac{b_1}{2} \text{ where} \qquad (18)$$

-continued $$K_{next} = \ln\left[\frac{1}{1-v_{th}} * \left(1 + \frac{2T_{cur}}{b_1}\right)\right]$$

In the initial delay $T_1$ calculation, an Elmore delay $T_{ED}$ is used as the current delay value for the time variable t of an exponential function, as expressed by Equation (19):

$$T_1 = K_1 * \frac{2b_2}{b_1} = K_1 * \frac{b_1}{2} \quad (19)$$

where $\left|K_1 = \ln\left[\frac{1}{1-v_{th}} * \left(1 + \frac{2T_{ED}}{b_1}\right)\right]\right|$ For a 20% threshold, the Elmore delay is $T_{ED}=0.22*b_1$.

If the difference is not within a predetermined range, for example, a range where $T_{next} \in [0.5T_{cur}, T_{cur}]$, the method returns to step 244, where another delay is computed. The next delay is determined using the previously computed delay as the time value for the exponential function, that is, $$\left|K_2 = \ln\left[\frac{1}{1-v_{th}} * \left(1 + \frac{2T_1}{b_1}\right)\right]\right|$$

If the difference between the next delay $T_{next}$ and the current delay $T_{cur}$ is within a predetermined range, next delay $T_{next}$ is an acceptable estimate for interconnect delay at step 238, and the method terminates.

A technical advantage of one embodiment is that the interconnect delay is determined using the inductance of the interconnect. Global interconnects typically have large cross-sections and are driven by drivers with small resistance. This may result in an inductive impedance that is greater than a resistive impedance and that affects interconnect delay. Accordingly, interconnect delay is estimated using inductance in order to improve the accuracy of the estimation.

Another technical advantage of one embodiment is that the interconnect delay is estimated according to a damping response of the interconnect. When inductive impedance is taken into account, the damping response may also be determined, which provides a better description of the interconnect. Accordingly, estimating interconnect delay according to the damping response provides an improved estimation.

Although an embodiment of the invention and its advantages are described in detail, a person skilled in the art could make various alterations, additions, and omissions without departing from the spirit and scope of the present invention as defined by the appended claims.

What is claimed is:

1. A method for estimating interconnect delay, the method comprising:
   determining an interconnect inductance of an interconnect;
   determining a transfer function using the interconnect inductance;
   determining at least two poles of the transfer function;
   estimating an interconnect response using the two poles, the interconnect response describing a reaction of the interconnect to an applied signal; and
   estimating an interconnect delay from the interconnect response, the interconnect delay describing a delay of the interconnect.

2. The method of claim 1, further comprising:
   determining a damping case from the two poles; and
   estimating the interconnect delay according to the damping case.

3. The method of claim 1, further comprising:
   determining an overdamped case from the two poles; and
   estimating the interconnect delay using one pole.

4. The method of claim 1, further comprising:
   determining an underdamped case from the two poles; and
   estimating the interconnect delay by:
     computing a first delay using an Elmore delay; and
     computing a second delay using the first delay as a value for a time variable.

5. The method of claim 1, further comprising:
   determining an underdamped case from the two poles; and
   estimating the interconnect delay by repeating the following:
     computing a current delay; and
     computing a next delay using the current delay as a value for a time variable, until a difference between the current delay and the next delay is within a predetermined range.

6. The method of claim 1, further comprising:
   determining a critically damped case from the two poles; and
   estimating the interconnect delay by:
     computing a first delay using an Elmore delay; and
     computing a second delay using the first delay as a value for a time variable.

7. The method of claim 1, further comprising:
   determining a critically damped case from the two poles; and
   estimating the interconnect delay by repeating the following:
     computing a current delay, and
     computing a next delay using the current delay as a value for a time variable, until a difference between the current delay and the next delay is within a predetermined range.

8. A system for estimating interconnect delay, the system comprising:
   a memory operable to store information about an interconnect; and
   a processor coupled to the memory operable to:
     determine an interconnect inductance of the interconnect from the information;
     determine a transfer function using the interconnect inductance;
     determine at least two poles of the transfer function;
     estimate an interconnect response using the two poles, the interconnect response describing a reaction of the interconnect to an applied signal; and
     estimate an interconnect delay from the interconnect response, the interconnect delay describing a delay of the interconnect.

9. The system of claim 8, wherein the processor is operable to:
   determine a damping case from the two poles; and
   estimate the interconnect delay according to the damping case.

10. The system of claim 8, wherein the processor is operable to:

determine an overdamped case from the two poles; and estimate the interconnect delay from one pole.

11. The system of claim 8, wherein the processor is operable to:

determine an underdamped case from the two poles; and estimate the interconnect delay by:

computing a first delay using an Elmore delay; and computing a second delay using the first delay as a value for a time variable.

12. The system of claim 8, wherein the processor is operable to:

determine an underdamped case from the two poles; and estimate the interconnect delay by repeating the following:

computing a current delay; and computing a next delay using the current delay as a value for a time variable, until a difference between the current delay and the next delay is within a predetermined range.

13. The system of claim 8, wherein the processor is operable to:

determine a critically damped case from the two poles; and estimate the interconnect delay by:

computing a first delay using an Elmore delay; and computing a second delay using the first delay as a value for a time variable.

14. The system of claim 8, wherein the processor is operable to:

determine a critically damped case from the two poles; and estimate the interconnect delay by repeating the following:

computing a current delay; and computing a next delay using the current delay as a value for a time variable, until a difference between the current delay and the next delay is within a predetermined range.

15. Logic for estimating interconnect delay encoded on media, the logic embodied in a medium and operable to:

determine an interconnect inductance of an interconnect;

determine a transfer function using the interconnect inductance;

determine at least two poles of the transfer function;

estimate an interconnect response using the two poles, the interconnect response describing a reaction of the interconnect to an applied signal; and estimate an interconnect delay from the interconnect response, the interconnect delay describing a delay of the interconnect.

16. The logic of claim 15, the logic operable to:

determine a damping case from the two poles; and estimate the interconnect delay according to the damping case.

17. The logic of claim 15, the logic operable to:

determine an overdamped case from the two poles; and estimate the interconnect delay using one pole.

18. The logic of claim 15, the logic operable to:

determine an underdamped case from the two poles; and estimate the interconnect delay by:

computing a first delay using an Elmore delay; and computing a second delay using the first delay as a value for a time variable.

19. The logic of claim 15, the logic operable to:

determine an underdamped case from the two poles; and estimate the interconnect delay by repeating the following:

computing a current delay; and computing a next delay using the current delay as a value for a time variable, until a difference between the current delay and the next delay is within a predetermined range.

20. The logic of claim 15, the logic operable to:

determine a critically damped case from the two poles; and estimate the interconnect delay by:

computing a first delay using an Elmore delay; and computing a second delay using the first delay as a value for a time variable.

21. The logic of claim 15, the logic operable to:

determine a critically damped case from the two poles; and estimate the interconnect delay by repeating the following:

computing a current delay; and computing a next delay using the current delay as a value for a time variable, until a difference between the current delay and the next delay is within a predetermined range.

22. A system for estimating interconnect delay, the system comprising:

an inductance module operable to determine an interconnect inductance of an interconnect;

a transfer function module operable to determine a transfer function using the interconnect inductance;

a processor operable to:

determine at least two poles of the transfer function;

determine a damping case from the two poles, the damping case comprising an overdamped case, an underdamped case, and a critically damped case;

a response module operable to estimate an interconnect response using the two poles, the interconnect response describing a reaction of the interconnect to an applied signal; and a delay module operable to:

estimate the interconnect delay from one pole, if the damping case is the overdamped case, the interconnect delay describing a delay of the interconnect;

estimate the interconnect delay by:

computing a first delay using an Elmore delay; and computing a second delay using the first delay as a value for a time variable, if the damping case is the underdamped case or the critically damped case.

* * * * *